(12) United States Patent
Malhotra et al.

(10) Patent No.: US 8,847,397 B2
(45) Date of Patent: *Sep. 30, 2014

(54) HIGH WORK FUNCTION, MANUFACTURABLE TOP ELECTRODE

(71) Applicant: Intermolecular, Inc., San Jose, CA (US)

(72) Inventors: Sandra G. Malhotra, Fort Collins, CO (US); Hanhong Chen, Milpitas, CA (US); Wim Deweerd, San Jose, CA (US); Arthur Gevondyan, San Francisco, CA (US); Hiroyuki Ode, Higashihiroshima (JP)

(73) Assignee: Intermolecular, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/737,263

(22) Filed: Jan. 9, 2013

(65) Prior Publication Data

US 2014/0183697 A1 Jul. 3, 2014

Related U.S. Application Data

(63) Continuation of application No. 13/727,962, filed on Dec. 27, 2012.

(51) Int. Cl.
*H01L 29/40* (2006.01)
*H01L 23/52* (2006.01)
*H01L 23/48* (2006.01)
*H01L 29/92* (2006.01)
*H01L 49/02* (2006.01)
*H01L 51/52* (2006.01)

(52) U.S. Cl.
CPC ............. *H01L 29/92* (2013.01); *H01L 51/5206* (2013.01); *H01L 28/65* (2013.01)
USPC .......................................... 257/763; 257/764

(58) Field of Classification Search
CPC ...... H01L 51/5206; H01L 28/65; H01L 28/75
USPC .................................................. 257/763, 764
See application file for complete search history.

(56) References Cited

U.S. PATENT DOCUMENTS

| 5,912,797 | A * | 6/1999 | Schneemeyer et al. ........ 361/311 |
| 7,968,452 | B2 * | 6/2011 | Chen et al. ..................... 438/635 |
| 8,129,704 | B2 * | 3/2012 | Phatak et al. ..................... 257/2 |
| 8,183,553 | B2 * | 5/2012 | Phatak et al. ..................... 257/4 |
| 8,415,657 | B2 * | 4/2013 | Rui et al. ........................ 257/15 |
| 8,541,868 | B2 * | 9/2013 | Malhotra et al. .............. 257/532 |
| 2011/0222207 | A1 * | 9/2011 | Lee et al. ....................... 361/322 |
| 2013/0099191 | A1 * | 4/2013 | Kuse et al. ......................... 257/4 |

* cited by examiner

*Primary Examiner* — Nicholas Tobergte

(57) ABSTRACT

Provided are MIM DRAM capacitors and methods of forming thereof. A MIM DRAM capacitor may include an electrode layer formed from a high work function material (e.g., greater than about 5.0 eV). This layer may be used to reduce the leakage current through the capacitor. The capacitor may also include another electrode layer having a high conductivity base portion and a conductive metal oxide portion. The conductive metal oxide portion serves to promote the growth of the high k phase of the dielectric layer.

20 Claims, 6 Drawing Sheets

HIGH WORK FUNCTION, MANUFACTURABLE TOP ELECTRODE

CROSS-REFERENCE TO RELATED APPLICATIONS

This is a Continuation Application of U.S. patent application Ser. No. 13/727,962, filed on Dec. 27, 2012, which is herein incorporated by reference for all purposes.

This document relates to the subject matter of a joint research agreement between Intermolecular, Inc. and Elpida Memory, Inc.

FIELD OF THE DISCLOSURE

The present disclosure relates generally to the field of dynamic random access memory (DRAM), and more particularly to methods of forming a capacitor stack for improved DRAM performance.

BACKGROUND OF THE DISCLOSURE

Dynamic random access memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d, and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors cannot be reduced without limit in order to avoid leakage current caused by tunneling mechanisms which exponentially increases as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. titanium nitride), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k-values greater than about 40. Such materials are generally classified as high-k materials. Representative examples of high-k materials for MIM capacitors are non-conducting metal oxides, non-conducting metal nitrides, non-conducting metal silicates or combinations thereof. These dielectric materials may also include additional dopant materials.

A figure of merit in DRAM technology is the electrical performance of the dielectric material as compared to SiO$_2$ known as the Equivalent Oxide Thickness (EOT). A high-k material's EOT is calculated using a normalized measure of silicon dioxide (SiO$_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Leakage current in capacitor dielectric materials can be due to Schottky emission, Frenkel-Poole defects (e.g. oxygen vacancies ($V_{ox}$) or grain boundaries), or Fowler-Nordheim tunneling. Schottky emission, also called thermionic emission, is a common mechanism and is the heat-induced flow of charge over an energy barrier whereby the effective barrier height of a MIM capacitor controls leakage current. The effective barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. Fowler-Nordheim emission allows the conduction of charges through a dielectric layer through tunneling. As such, the Fowler-Nordheim emission behavior of a dielectric layer is generally determined by the physical thickness of the dielectric layer. This leakage current is a primary driving force in the adoption of high-k dielectric materials. The use of high-k materials allows the physical thickness of the dielectric layer to be as thick as possible while maintaining the required capacitance (see Eqn 1 above).

Therefore, there is a need to develop processes that allow the formation of a capacitor stack that contributes to lower leakage current, and contributes to higher device speed and lower power usage.

SUMMARY OF THE DISCLOSURE

The following summary of the disclosure is included in order to provide a basic understanding of some aspects and features of the disclosure. This summary is not an extensive overview of the disclosure and as such it is not intended to particularly identify key or critical elements of the disclosure or to delineate the scope of the invention. Its sole purpose is to present some concepts of the disclosure in a simplified form as a prelude to the more detailed description that is presented below.

In some embodiments, a metal oxide first electrode layer is formed as part of a MIM DRAM capacitor stack. The first electrode layer may also include a highly conductive base layer. In some embodiments, a high work function layer is formed above the dielectric layer to reduce the leakage current. The second electrode layer may also include a highly conductive base layer. In some embodiments, a second electrode layer is doped with a high work function material to reduce the leakage current.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
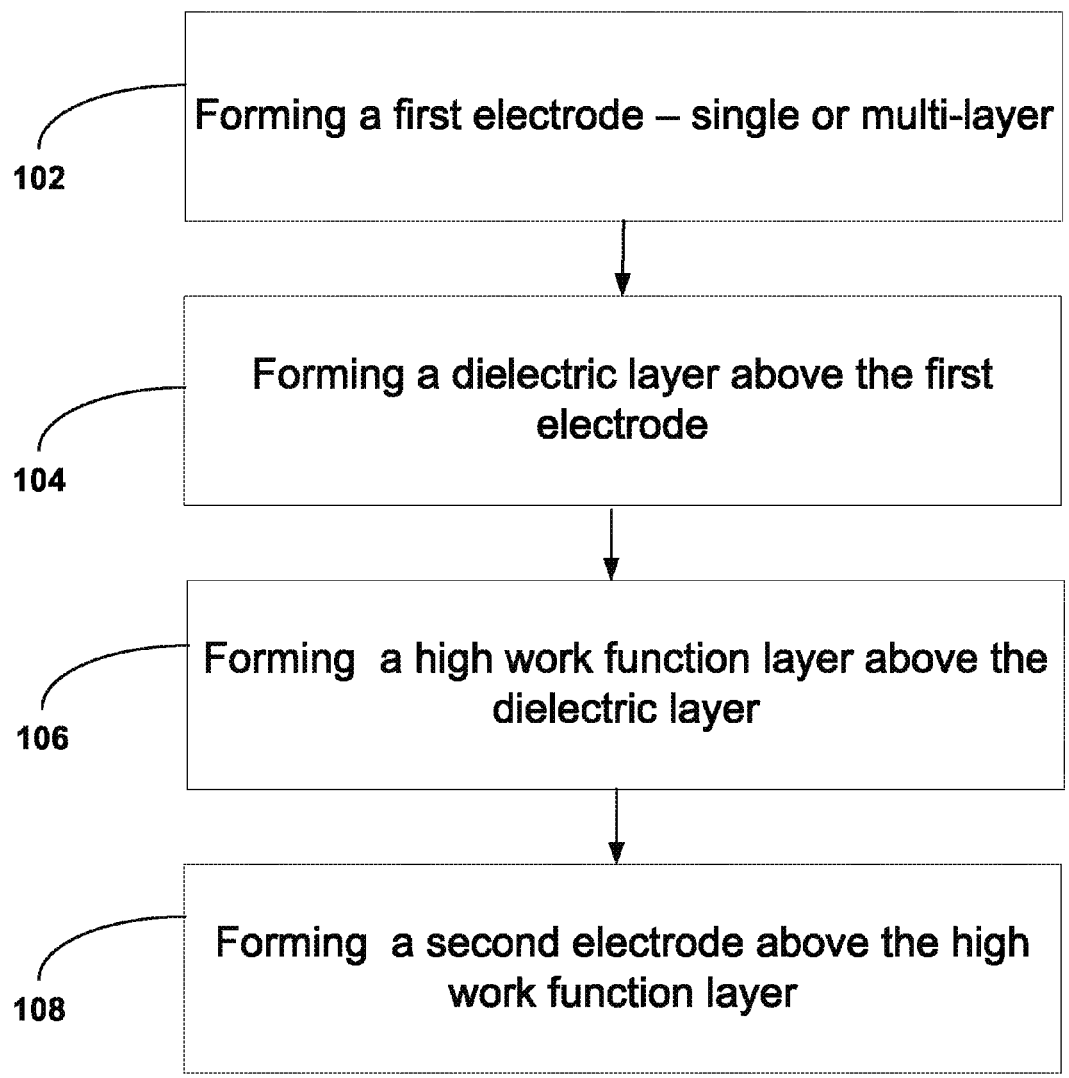
FIG. 1 illustrates a flow chart illustrating a method for fabricating a DRAM capacitor stack in accordance with some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

As used herein, the phrase "conductive metal oxide" will be understood to include the typical stoichiometric metal oxides as well as conductive non-stoichiometric metal oxides wherein the oxygen to metal ratio is not equal to the stoichiometric ratio. As an example, "conductive molybdenum oxide" will include $MoO_2$ as well as those conductive molybdenum oxides wherein the oxygen to metal ratio is slightly greater than or slightly less than 2. Those skilled in the art will understand that metal-oxygen compounds that are slightly off of the stoichiometric ratio will also be conductive and will fall within the scope of the present disclosure. As used herein, the phrase "conductive metal oxide" will be understood to include metal oxide materials having a resistivity of less than about 10 $\Omega$cm.

It must be noted that as used herein and in the claims, the singular forms "a," "and" and "the" include plural referents unless the context clearly dictates otherwise. Thus, for example, reference to "a layer" also includes two or more layers, and so forth. As an example, those skilled in the art will understand that an "electrode layer" may include a single layer or may include a "bilayer" of two materials.

One class of high-k dielectric materials possessing the characteristics considered for implementation in advanced DRAM capacitors are high-k metal oxide materials. Titanium oxide and zirconium oxide are two metal oxide dielectric materials which are candidates in terms of serving as high-k dielectric materials for implementation in DRAM capacitors. Other metal oxide high-k dielectric materials that have attracted attention include aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, etc.

The dielectric constant of a dielectric material may be dependent upon the crystalline phase(s) of the material. For example, in the case of titanium oxide (specifically $TiO_2$), the anatase crystalline phase of titanium oxide has a dielectric constant of approximately 40, while the rutile crystalline phase of titanium oxide can have a dielectric constant of approximately >80. Due to the higher-k value of the rutile-phase, it is desirable to produce titanium oxide based DRAM capacitors with the titanium oxide in the rutile-phase. The relative amounts of the anatase phase and the rutile phase can be determined from x-ray diffraction (XRD). From Eqn. 1 above, a titanium oxide material in the rutile-phase could be physically thicker and maintain the desired capacitance. The increased physical thickness is important for lowering the leakage current of the capacitor. The anatase phase will transition to the rutile phase at high temperatures (>800 C). However, high temperature processes are undesirable in the manufacture of DRAM devices.

The crystal phase of an adjacent material can be used to influence the growth of a specific crystal phase of a material if their crystal structures are similar and their lattice constants are similar. This technique is well known in technologies such as epitaxial growth. The same concepts have been extended to the growth of thin films where the adjacent material can be used as a "template" to encourage the growth of a desired crystalline phase over other competing crystal phases.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric material within the DRAM capacitor. Metals, such as platinum, gold, ruthenium, and ruthenium oxide are examples of high work function electrode materials suitable for inhibiting device leakage in a DRAM capacitor having a high-k dielectric material. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Additionally, DRAM capacitor stacks may undergo various refinement process steps after fabrication. These refinement processes may include post-fabrication chemical and thermal processing (i.e., oxidation or reduction). For instance, after initial DRAM capacitor stack fabrication, a number of high temperature (up to about 600 C) processes may be applied to complete the device fabrication. During these subsequent process steps, the DRAM capacitor materials must remain chemically, physically, and structurally stable. They must maintain the structural, compositional, physical, and electrical properties that have been developed. Furthermore, they should not undergo significant interaction or reaction which may degrade the performance of the DRAM capacitor.

Conductive metal oxides, conductive metal silicides, conductive metal carbides, conductive metal nitrides, or combinations thereof include other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Conductive metal nitrides, such as titanium nitride, tantalum nitride, tungsten nitride, and the like, are examples of candidate materials that might be used as DRAM capacitor electrodes with titanium nitride being the most popular. Different compounds may have different crystal structures, electrical properties, etc. It is important to utilize the proper compound for the desired application.

In some embodiments, molybdenum has several binary oxides, of which $MoO_2$ and $MoO_3$ are two examples. These two oxides of molybdenum have different properties. $MoO_2$ is conductive and has shown great promise as an electrode layer in DRAM capacitors. $MoO_2$ has a distorted rutile crystal structure and can serve as an acceptable template to promote the deposition of the rutile-phase of titanium oxide as discussed above. $MoO_2$ also has a high work function (can be >5.0 eV depending on process history) which helps to minimize the leakage current of the DRAM device. However, oxygen-rich phases ($MoO_{2+x}$) of $MoO_2$ degrade the performance of the $MoO_2$ electrode layer because they act more like insulators and have crystal structures that do not promote the formation of the rutile-phase of titanium oxide. For example, $MoO_3$ (the most oxygen-rich phase) is a dielectric material and has an orthorhombic crystal structure.

Generally, a deposited thin film may be amorphous, crystalline, or a mixture thereof. Furthermore, several different crystalline phases may exist. Therefore, processes (both deposition and post-treatment) are developed to maximize the formation of crystalline $MoO_2$ and to minimize the presence of $MoO_{2+x}$ phases. Deposition processes and post-treatment processes in an inert or reducing atmosphere have been developed that allow crystalline $MoO_2$ to be used as the first electrode layer (i.e. bottom electrode) in MIM DRAM capacitors with titanium oxide or doped-titanium oxide high-k dielectric layers. Examples of the post-treatment process are further described in U.S. application Ser. No. 13/084,666 filed on Apr. 12, 2011, entitled "METHOD FOR FABRICATING A DRAM CAPACITOR" which is incorporated herein by reference. Other conductive metal oxides that may be used as a template for the rutile phase of titanium oxide include the conductive compounds of chromium oxide, cobalt oxide, iridium oxide, manganese oxide, nickel oxide, ruthenium oxide, tin oxide, or tungsten oxide.

The use of conductive metal oxides (e.g. molybdenum oxide) as a first electrode layer can be combined with a higher conductivity base layer (e.g. titanium nitride) to form the first electrode layer. This combination exhibits the high conductivity and device speed of the titanium nitride layer with the rutile templating properties of the conductive metal oxide. However, the use of conductive metal oxides (e.g. molybdenum oxide) as a second electrode layer is difficult because of the tendency of the metal oxide materials to form oxygen-rich compounds. At this step in the manufacture of the DRAM device, an anneal treatment in a reducing atmosphere (e.g. forming gas) is not possible because the reducing atmosphere would increase the concentration of oxygen vacancies in the dielectric layer and increase the leakage current. Therefore, other high work function materials must be employed as part of the second electrode layer.

DRAM capacitor stacks are formed from a number of deposited thin films. Generally, a deposited thin film may be amorphous, crystalline, or a mixture thereof. Furthermore, several different crystalline phases may exist. Therefore, processes (both deposition and post-treatment) must be developed to maximize the formation of the desired composition and crystalline phase of the thin film. The thin films used to form the MIM DRAM capacitor stack may be formed using any common technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various materials discussed below. Those skilled in the art will appreciate that the teachings described below are not limited by the technology used for the deposition process.

Figure 2:
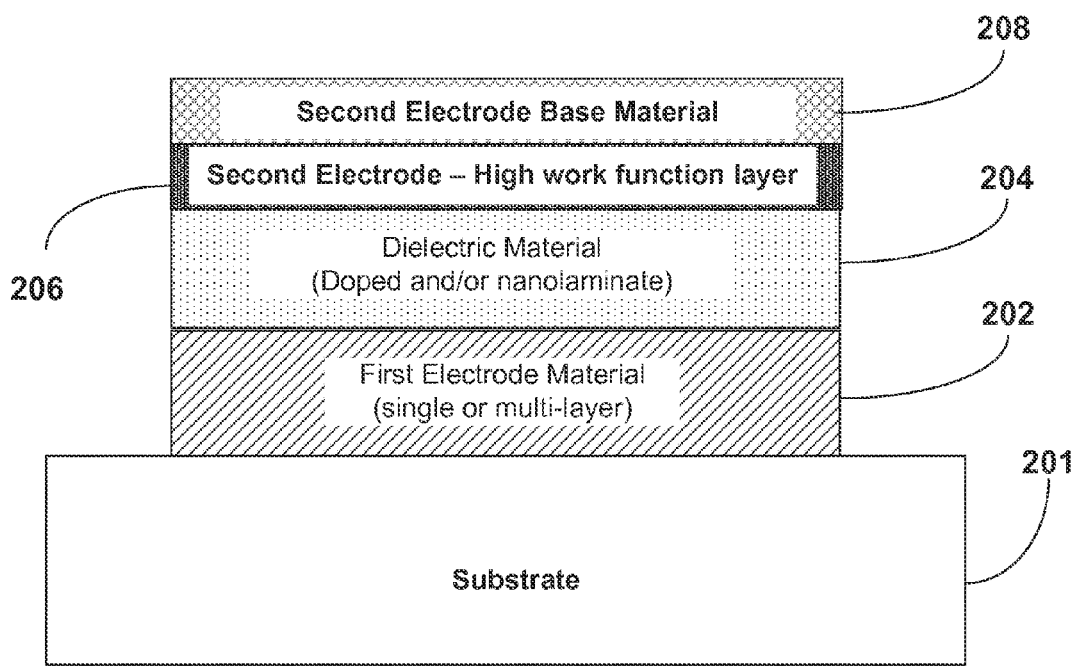
FIG. 2 illustrates a simplified cross-sectional view of a DRAM capacitor stack fabricated in accordance with some embodiments.
Figure 4:
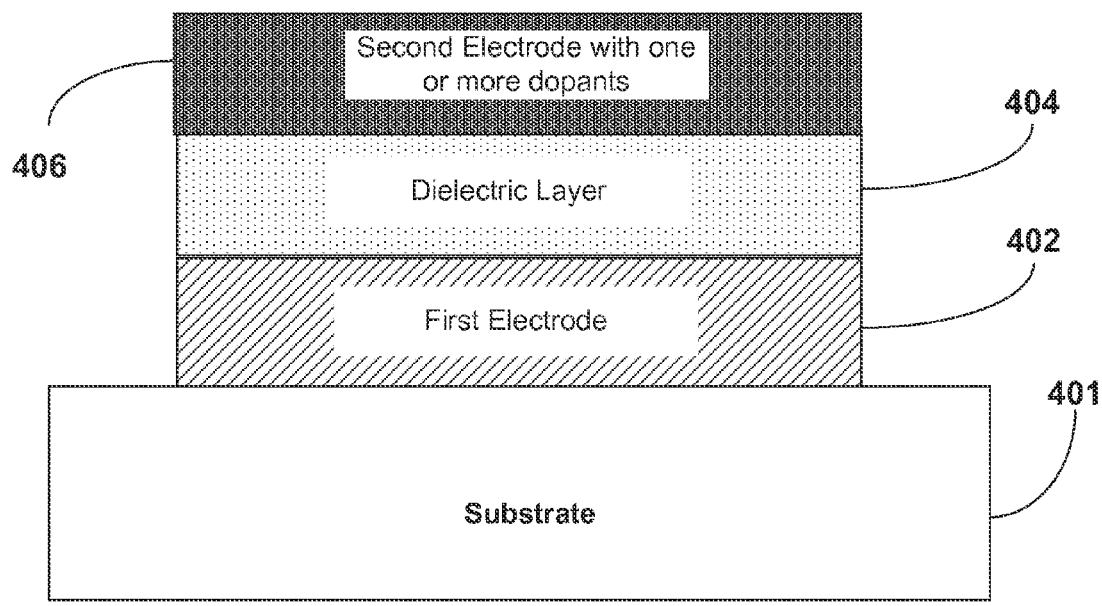
FIG. 4 illustrates a simplified cross-sectional view of a DRAM capacitor stack fabricated in accordance with some embodiments.
Figure 5:
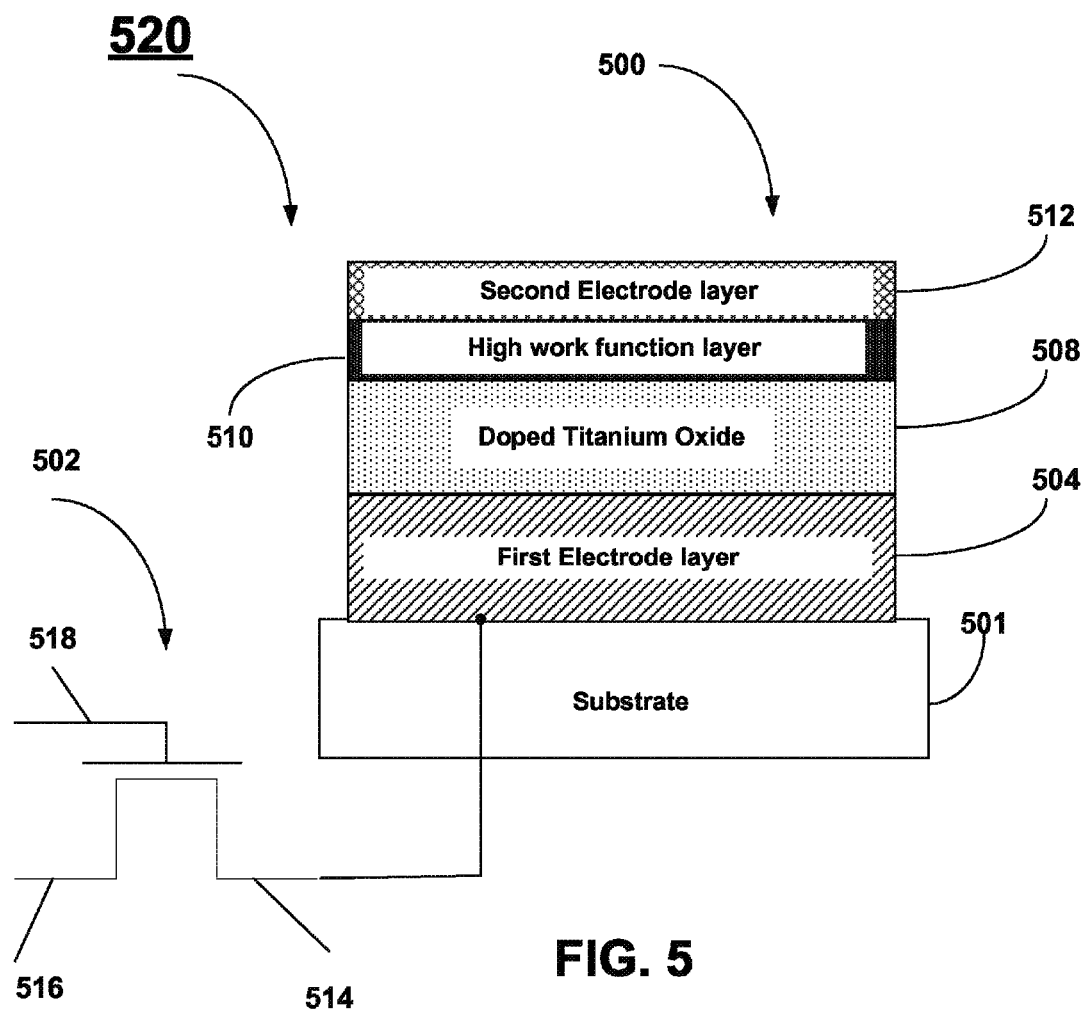
FIG. 5 illustrates a simplified cross-sectional view of a DRAM memory cell fabricated in accordance with some embodiments.

In FIGS. 2 and 4-5 described below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

FIG. 1 illustrates a process flowchart corresponding to a method, 100, for fabricating a DRAM capacitor stack. Operation 102, includes forming a first electrode layer above a substrate. Examples of suitable electrode layers include metals, metal alloys, conductive metal oxides, conductive metal silicides, conductive metal nitrides, and combinations thereof. One class of materials is the conductive metal oxides. In some embodiments, the first electrode layer may be formed from layers of different materials. As an example, the first electrode layer may be formed from a metal or conductive metal nitride and a conductive metal oxide. In this example, the metal or conductive metal nitride serves as a base layer and serves as the primary conductor in the first electrode layer. In this example, the conductive metal oxide serves both to protect the metal or conductive metal nitride layer from oxidation during the formation of the subsequent dielectric layer, but also serves as a template for the high k phase of the dielectric layer. The first electrode layer can then be subjected to an annealing process (not shown). Operation 104, involves forming a dielectric layer above the first electrode layer. The dielectric layer may include one or more dopants. The dielectric layer may be formed from a single layer or may be formed from several layers (i.e. a nanolaminate). Optionally, the dielectric layer can then be subjected to a post dielectric anneal (PDA) treatment (not shown). The PDA step serves to crystallize the dielectric layer and fill oxygen vacancies. The second electrode layer may include multiple layers. The next step, 106, includes forming a high work function layer from a material having a high work function above the dielectric layer. As used herein, it will be understood that "high work function" will be defined as being greater than 5.0 eV. Examples of suitable high work function layers include conductive molybdenum oxide, nickel, nickel oxide, platinum, palladium, iridium, and gold, among others. The next step, 108, includes forming a second electrode layer above the layer having a high work function. Examples of suitable second electrode layers include metals, metal alloys, conductive metal oxides, conductive metal silicides, conductive metal nitrides, and combinations thereof. In this example, the second electrode layer serves as the primary conductor in the second electrode layer. This sequence of steps forms a capacitor stack. Optionally, the capacitor stack can then be subjected to PMA treatment (not shown). Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference for all purposes.

FIG. 2 illustrates a schematic representation of capacitor stack, 200, consistent with some embodiments. Using the method as outlined in FIG. 1 and described above, first electrode material, 202, is formed above substrate, 201. Generally, the substrate has already received several processing steps in the manufacture of a full DRAM device. Examples of suitable first electrode layer, 201, include metals, metal alloys, conductive metal oxides, conductive metal nitrides, conductive metal silicides, etc. In some embodiments, the first electrode layer includes a conductive metal oxide. As discussed previously, the first electrode layer may include multiple layers. In some embodiments, the first electrode layer includes a high conductivity layer (e.g. titanium nitride) and a conductive metal oxide layer (e.g. conductive molybdenum oxide). The first electrode layer, 202, can be annealed to crystallize the layer.

In the next step, dielectric material, 204, would then be formed above the first electrode material, 202. A wide variety of dielectric layers have been targeted for use in DRAM capacitors. Examples of suitable dielectric layers include aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. These dielectric layers may be formed as a single layer or may be formed as a hybrid or nanolaminate structure. In some embodiments, the dielectric layer includes doped titanium oxide. Suitable dopants for use with titanium oxide dielectric layers include Al, Ce, Co, Er, Ga, Gd, Ge, Hf, La, Mg, Si, Sn, Sr, Y, Zr, or combinations thereof. Typically, dielectric material, 204, is subjected to a PDA treatment before the formation of the second electrode layer as mentioned earlier. The substrate with the first electrode and dielectric material is then annealed in an oxidizing atmosphere comprising between about 0% $O_2$ to about 100% $O_2$ in $N_2$ and advantageously, between about 0% $O_2$ to about 20% $O_2$ in $N_2$ at temperatures between about 400 C to about 600 C for between about 1 millisecond to about 60 minutes.

In the next step, a high work function layer, 206, may be formed above dielectric material, 204. Examples of suitable high work function layer materials include metals, metal alloys, conductive metal oxides, conductive metal nitrides, conductive metal silicides, conductive metal carbides, etc. having a work function greater than 5.0 eV. Second electrode material, 208, may be formed above the high work function layer, 206. Examples of suitable second electrode layers include metals, metal alloys, conductive metal oxides, conductive metal nitrides, conductive metal silicides, etc. The purpose of this layer is to provide high conductivity to the second electrode structure. In some embodiments, the second electrode layer is a metal or a conductive metal nitride.

In some embodiments, the first electrode material is formed from two sublayers. The first layer, formed above the substrate, 201, may include conductive titanium nitride. The titanium nitride layer may be formed by known techniques such as PVD, CVD, ALD, etc. In some embodiments, the titanium nitride layer has a thickness between 20 A and 150 A, such as about 100 A. A second layer that is also part of the first electrode layer includes a conductive metal oxide, and preferably, conductive molybdenum oxide. The molybdenum oxide layer may be formed by known techniques such as PVD, CVD, ALD, etc. In some embodiments, the molybdenum oxide layer has a thickness between 25 A and 100 A. In some embodiments, the molybdenum oxide layer has a thickness of 50 A. The molybdenum oxide electrode layer can be formed at a process temperature between about 125 C and 400 C using an ALD process technology. Optionally, the substrate with the first electrode layer is then annealed in a reducing atmosphere including between about 0% and about 20% $H_2$ in an inert gas, for example, $N_2$ and advantageously between about 5% and about 10% $H_2$ in $N_2$ between 300 C and 600 C for between about 1 millisecond and about 60 minutes.

In the next step, dielectric layer, 204, may be formed above the annealed first electrode layer, 202. A wide variety of dielectric materials may be used for DRAM capacitors.

Examples of suitable dielectric materials include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or doped versions of the same. These dielectric layers may be formed as a single layer or may be formed as a hybrid or nanolaminate structure. A specific dielectric layer of interest is titanium oxide doped with one of Al, Ce, Co, Er, Ga, Gd, Ge, Hf, In, La, Lu, Mg, Mn, Nd, Pr, Sc, Si, Sn, Sr, Y, Zr, or combinations thereof. A specific dielectric layer of interest is titanium oxide doped with Al to between about 5 atomic % and about 15 atomic % Al (Al/(Al+Ti) atomic %).

In some embodiments, the doped dielectric layer includes between about 60 A to about 100 A of titanium oxide wherein at least 30% of the titanium oxide is present in the rutile phase. In some embodiments, the dielectric layer further includes a zirconium oxide layer. In some embodiments, the titanium oxide layer had a thickness of about 65 A and the zirconium oxide layer had a thickness of about 12 A. Generally, the titanium oxide dielectric layer may either be a single film or may include a nanolaminate. Advantageously, the titanium oxide layer is doped with Al at a concentration between about 5 atomic % and about 15 atomic % Al. In some embodiments, the titanium oxide layer is doped with Al at a concentration of about 10 atomic %. The titanium oxide dielectric layer is formed at a process temperature between about 200 C and 350 C using an ALD process technology. The titanium oxide dielectric layer may further include a zirconium oxide capping layer.

In the next step, a high work function layer, 206, may be formed above dielectric layer, 204. Examples of suitable high work function layer materials include metals, metal alloys, conductive metal oxides, conductive metal nitrides, conductive metal silicides, conductive metal carbides, etc. having a work function greater than 5.0 eV. In some embodiments, the high work function layer includes nickel oxide. The high work function layer may be formed using a PVD technique such as the reactive sputtering of a nickel target in a sputtering atmosphere containing oxygen. The reactive sputtering of the nickel oxide may occur in the "poisoned" mode wherein the oxygen concentration in the sputtering atmosphere is high enough to maintain a layer of nickel oxide on the surface of the sputtering target. In some embodiments, the thickness of the high work function layer may be between 10 A and 500 A. In some embodiments, the thickness of the high work function layer is 40 A.

In the next step, the second electrode layer, 208, is formed above high work function layer, 206 to complete the formation of the capacitor stack. The second electrode layer may include one of, metals, metal alloys, conductive metal oxides, conductive metal nitrides, conductive metal silicides, or combinations thereof, etc. Examples of suitable materials for the second electrode layer include cobalt, cobalt nitride, iridium, molybdenum nitride, molybdenum oxide, nickel, nickel nitride, nickel oxide, platinum, palladium, ruthenium, ruthenium oxide, tantalum nitride, titanium nitride, tungsten nitride, vanadium nitride, or combinations thereof. In some embodiments, the second electrode layer, 208, includes a titanium nitride, platinum, or ruthenium layer. The second electrode layer may be formed by known techniques such as PVD, CVD, ALD, etc. In some embodiments, the second electrode layer has a thickness between 20 A and 150 A, and preferably about 100 A. The capacitor stack may receive a PMA treatment as discussed previously. In some embodiments, the PMA treatment includes an anneal for between 1 millisecond and 60 minutes at temperatures between 300 C to 600 C in $N_2$, or in an oxidizing atmosphere comprising 0% $O_2$ to 20% $O_2$.

Table 1 presents data (k value, EOT, and leakage current density) collected on capacitor stacks using nickel oxide as the high work function layer. The capacitor stack included a first layer of titanium nitride with a thickness of 500 A deposited by PVD. A 200 A of conductive molybdenum oxide layer was formed on the titanium nitride layer to form the first electrode layer. The conductive molybdenum oxide layer was formed using a PVD technique. A dielectric layer including titanium oxide doped with 10 atomic % aluminum was formed over the conductive molybdenum oxide layer using an ALD technique. The dielectric layer also included a zirconium oxide layer. The titanium oxide layer had a thickness of about 65 A. The zirconium oxide layer had a thickness of about 12 A. The substrate with the first electrode layer and the dielectric layer received a PDA treatment including an anneal at 460 C in a dilute (e.g. <10%) oxygen atmosphere for 10 minutes. A high work function layer including nickel oxide with a thickness of 40 A was formed above the dielectric layer using a reactive PVD technique. A second electrode including platinum with a thickness of 500 A was formed above the high work function layer using a PVD technique to complete the formation of the capacitor stack. The capacitor stack received a PMA treatment including an anneal at 460 C in a dilute (e.g. <10%) oxygen atmosphere for 10 minutes.

TABLE 1

| Sample ID | K Value | EOT (nm) | J at 1 V (A/cm$^2$) |
|---|---|---|---|
| 1 | 47.1 | 0.65 | 8.33E−08 |
| 2 | 47.6 | 0.65 | 8.21E−08 |
| 3 | 48.8 | 0.63 | 7.83E−08 |
| 4 | 50.1 | 0.61 | 8.82E−08 |

Figure 3:
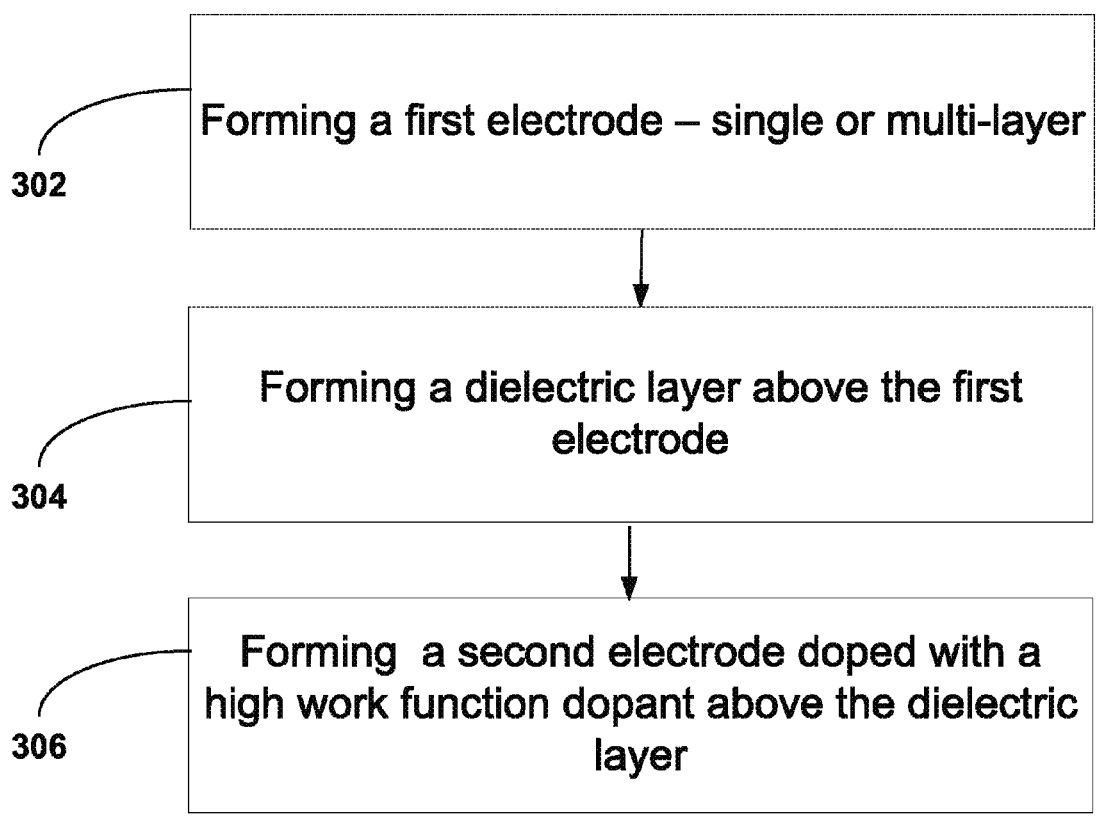
FIG. 3 illustrates a flow chart illustrating a method for fabricating a DRAM capacitor stack in accordance with some embodiments.

FIG. 3 illustrates a flowchart corresponding to a method, 300, for fabricating a DRAM capacitor stack. The initial step, 302, includes forming a first electrode layer above a substrate. Examples of suitable electrode layers include metals, metal alloys, conductive metal oxides, conductive metal silicides, conductive metal nitrides, and combinations thereof. A particularly interesting class of materials is the conductive metal oxides. In some embodiments, the first electrode layer may be formed from layers of different materials. As an example, the first electrode layer may be formed from a metal or conductive metal nitride and a conductive metal oxide. In this example, the metal or conductive metal nitride serves as a base layer and serves as the primary conductor in the first electrode layer. In this example, the conductive metal oxide serves both to protect the metal or conductive metal nitride layer from oxidation during the formation of the subsequent dielectric layer, but also serves as a template for the high k phase of the dielectric layer. The first electrode layer can then be subjected to an annealing process (not shown). The next step, 304, includes forming a dielectric layer above the first electrode layer. The dielectric layer may further include one or more dopants. The dielectric layer may be formed from a single layer or may be formed from several layers (i.e. a nanolaminate). Optionally, the dielectric layer can then be subjected to a post dielectric anneal (PDA) treatment (not shown). The PDA step serves to crystallize the dielectric layer and fill oxygen vacancies. The next step, 306, includes forming a second electrode layer above the dielectric layer. Examples of suitable second electrode layers include metals, metal alloys, conductive metal oxides, conductive metal silicides, conductive metal nitrides, and combinations thereof.

The second electrode layer is further doped with a material having a high work function. As used herein, it will be understood that "high work function" will be defined as being greater than 5.0 eV. Examples of suitable high work function materials include conductive molybdenum oxide, nickel, nickel oxide, and platinum, among others. This sequence of steps forms a capacitor stack. Optionally, the capacitor stack can then be subjected to PMA treatment (not shown).

FIG. 4 illustrates a simplified representation of capacitor stack, 400, in accordance with some embodiments. Using the method as outlined in FIG. 3 and described above, first electrode layer, 402, is formed above substrate, 401. Generally, the substrate has already received several processing steps in the manufacture of a full DRAM device. Examples of suitable first electrode layer, 402, include metals, metal alloys, conductive metal oxides, conductive metal nitrides, conductive metal silicides, etc. In some embodiments, the first electrode layer includes a conductive metal oxide. As discussed previously, the first electrode layer may include multiple layers. In some embodiments, the first electrode layer includes a high conductivity layer (e.g. titanium nitride) and a conductive metal oxide layer (e.g. conductive molybdenum oxide). The first electrode layer, 402, can be annealed to crystallize the layer.

In the next step, dielectric layer, 404, would then be formed above the first electrode layer, 402. A wide variety of dielectric layers have been targeted for use in DRAM capacitors. Examples of suitable dielectric layers include aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. These dielectric layers may be formed as a single layer or may be formed as a hybrid or nanolaminate structure. In some embodiments, the dielectric layer includes doped titanium oxide. Suitable dopants for use with titanium oxide dielectric layers include Al, Ce, Co, Er, Ga, Gd, Ge, Hf, La, Mg, Si, Sn, Sr, Y, Zr, or combinations thereof. Typically, dielectric layer, 304, is subjected to a PDA treatment before the formation of the second electrode layer as mentioned earlier.

In the next step, second electrode layer, 406, may be formed above the dielectric layer, 404. Examples of suitable second electrode layers include metals, metal alloys, conductive metal oxides, conductive metal nitrides, conductive metal silicides, etc. In some embodiments, the second electrode layer is a metal or a conductive metal nitride. The second electrode layer is further doped with a material having a high work function. Examples of suitable high work function materials include conductive molybdenum oxide, nickel, nickel oxide, and platinum, among others. This sequence of steps forms a capacitor stack. Optionally, the capacitor stack can then be subjected to PMA treatment (not shown).

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 5 is used to illustrate one DRAM cell, 520, manufactured using a high work function layer as discussed previously with reference to FIG. 2. The cell, 520, is illustrated schematically to include two principle components, a cell capacitor, 500, and a cell transistor, 502. The cell transistor is usually a MOS transistor having a gate, 518, source, 514, and drain, 516. The gate is usually connected to a word line and one of the source or drain is connected to a bit line. The cell capacitor has a lower or storage electrode, 504, and an upper or plate electrode, 512. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously in connection with FIG. 2, the cell capacitor, 500, includes a first electrode layer, 504, formed from multiple layers, formed on substrate, 501. The first electrode, 504, is connected to the source or drain of the cell transistor, 502. For illustrative purposes, the first electrode has been connected to the source, 514, in this example. For the purposes of illustration, first electrode layer, 504, will include a titanium nitride layer and a conductive molybdenum oxide layer as described previously. As discussed previously, first electrode layer, 504, may be subjected to an anneal in an inert or reducing atmosphere before the formation of the dielectric layer to crystallize the molybdenum oxide and to reduce any $MoO_{2+x}$ compounds that may have formed during the formation of the first electrode layer. Dielectric layer, 508, is formed above the first electrode layer. Examples of suitable dielectric layers include aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. For the purposes of illustration, dielectric layer, 508, will include titanium oxide. As discussed previously, the titanium oxide may be doped. Typically, the dielectric layer is then subjected to a PDA treatment. The high work function layer, 510, is then formed above the dielectric layer. Examples of suitable high work function layer materials include metals, metal alloys, conductive metal oxides, conductive metal nitrides, conductive metal silicides, conductive metal carbides, etc. having a work function greater than 5.0 eV. In some embodiments, the high work function layer includes nickel oxide. The second electrode layer, 512, is then formed above the high work function layer. For the purposes of illustration, the second electrode layer, 512, will be titanium nitride in this example. This completes the formation of the capacitor stack. The capacitor stack is then subjected to a PMA treatment.

Figure 6:
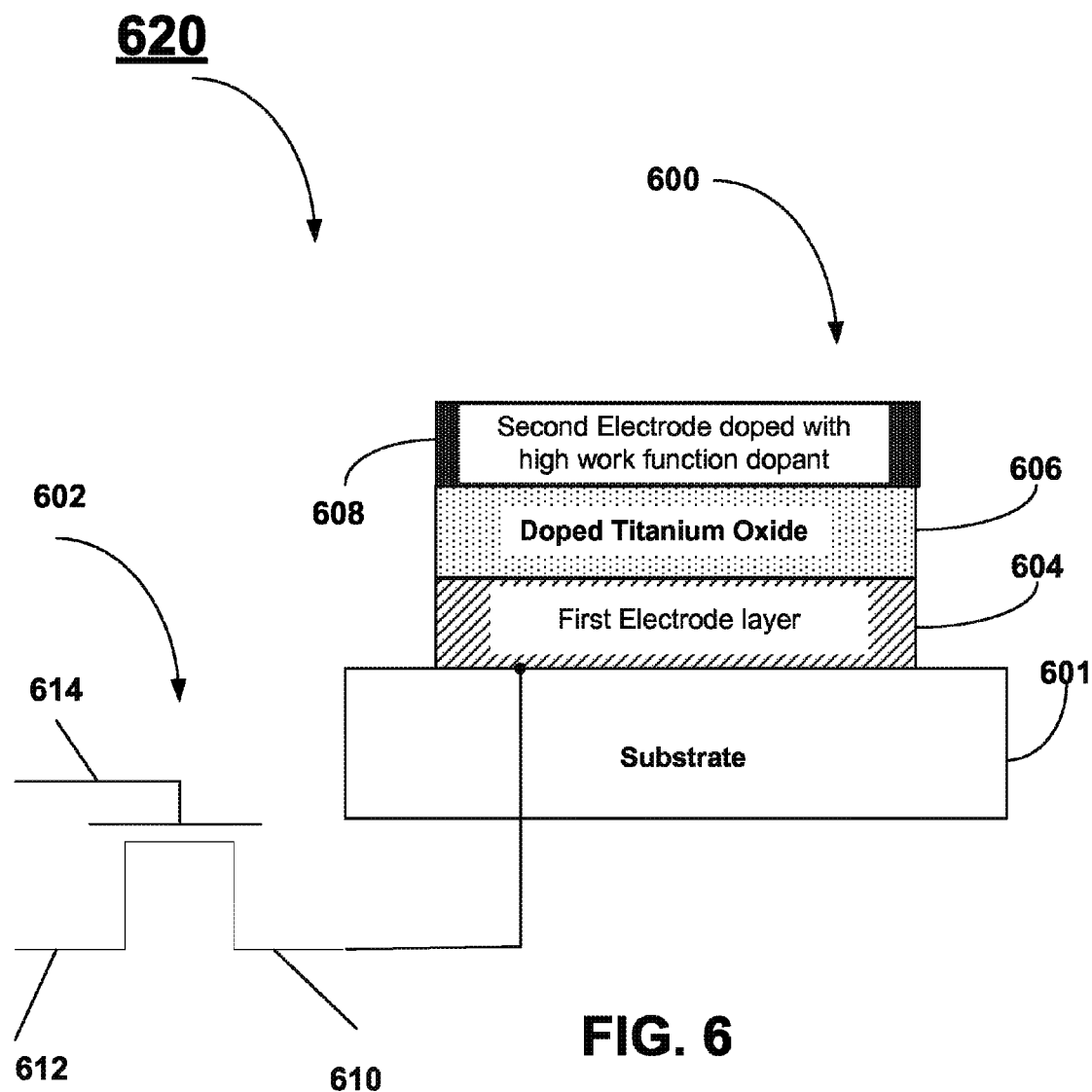
FIG. 6 illustrates a simplified cross-sectional view of a DRAM memory cell fabricated in accordance with some embodiments.

FIG. 6 is used to illustrate one DRAM cell, 620, manufactured using a high work function layer as discussed previously with reference to FIG. 4. The cell, 620, is illustrated schematically to include two principle components, a cell capacitor, 600, and a cell transistor, 602. The cell transistor is usually constituted by a MOS transistor having a gate, 614, source, 610, and drain, 612. The gate is usually connected to a word line and one of the source or drain is connected to a bit line. The cell capacitor has a lower or storage electrode, 604, and an upper or plate electrode, 608. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously in connection with FIG. 4, the cell capacitor, 600, includes a first electrode layer, 604, formed from multiple layers, formed on substrate, 601. The first electrode, 604, is connected to the source or drain of the cell transistor, 602. For illustrative purposes, the first electrode has been connected to the source, 610, in this example. For the purposes of illustration, first electrode layer, 604, will include a titanium nitride layer and a conductive molybdenum oxide layer as described previously. As discussed previously, first electrode layer, 604, may be subjected to an anneal in an inert or reducing atmosphere before the formation of the dielectric layer to crystallize the molybdenum oxide and to reduce any $MoO_{2+x}$ compounds that may have formed during the formation of the first electrode layer. Dielectric layer, 606, is formed above the first electrode layer. Examples of suitable dielectric layers include aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. For the purposes of illustration, dielectric layer, 606, will include titanium oxide. As discussed previously, the titanium oxide may be doped. Typically, the dielectric layer is then subjected to a PDA treatment. Second electrode layer, 608, may be formed above the dielectric layer, 606. Examples of suitable second electrode layers include metals, metal alloys, conductive metal oxides, conductive metal nitrides, conductive metal silicides, etc. In some embodiments, the second electrode layer is a metal or a conductive metal nitride. The second electrode layer is further doped with a material having a high work function. Examples of suitable high work function materials include conductive molybdenum oxide, nickel, nickel oxide, and platinum, among others. This sequence of steps forms a capacitor stack. Optionally, the capacitor stack can then be subjected to PMA treatment (not shown).

Although the foregoing examples have been described in some detail for purposes of clarity of understanding, the invention is not limited to the details provided. There are many alternative ways of implementing the invention. The disclosed examples are illustrative and not restrictive.

What is claimed:

1. A semiconductor layer stack comprising:
    a first electrode layer,
        wherein the first electrode layer comprises:
            a first layer formed above a substrate,
                wherein the first layer comprises a conductive metal nitride, and
            a second layer formed above the first layer,
                wherein the second layer comprises molybdenum oxide having a distorted rutile structure;
    a third layer formed above the second layer,
        wherein the third layer is a dielectric layer; and
    a second electrode layer formed above the third layer,
        wherein the second electrode layer comprises:
            a fourth layer,
                wherein the fourth layer has a work function greater than 5.0 eV, and
            a fifth layer formed above the fourth layer,
                wherein the fifth layer comprises a conductive metal nitride.

2. The semiconductor layer stack of claim 1, wherein the conductive metal nitride of the first layer comprises titanium nitride.

3. The semiconductor layer stack of claim 1, wherein the third layer comprises titanium oxide.

4. The semiconductor layer stack of claim 3, wherein the third layer further comprises a dopant, the dopant comprising at least one of Al, Ce, Co, Er, Ga, Gd, Ge, Hf, In, La, Lu, Mg, Mn, Nd, Pr, Sc, Si, Sn, Sr, Y, or Zr.

5. The semiconductor layer stack of claim 1, wherein the fourth layer comprises one of molybdenum oxide, nickel, nickel oxide, platinum, palladium, iridium, or gold.

6. The semiconductor layer stack of claim 5 wherein the fourth layer comprises nickel oxide.

7. The semiconductor layer stack of claim 1, wherein the fifth layer comprises one of ruthenium, platinum, titanium nitride, tantalum nitride, titanium-aluminum-nitride, tungsten, tungsten nitride, molybdenum, molybdenum nitride, or vanadium nitride.

8. The semiconductor layer stack of claim 7, wherein the fifth layer is titanium nitride.

9. The semiconductor layer stack of claim 1, wherein a material of the dielectric layer is in a rutile crystalline phase.

10. The semiconductor layer stack of claim 1, wherein the conductive metal nitride of the first layer comprises one of tantalum nitride or tungsten nitride.

11. The semiconductor layer stack of claim 1, wherein a conductivity of the first layer is greater than a conductivity of the second layer.

12. The semiconductor layer stack of claim 1, wherein the dielectric layer is a nanolaminate.

13. The semiconductor layer stack of claim 3, wherein the third layer further comprises a dopant, the dopant comprising aluminum.

14. The semiconductor layer stack of claim 13, wherein a concentration of the dopant in the third layer is between 5 atomic % and 15 atomic %.

15. The semiconductor layer stack of claim 1, further comprise a capping layer disposed between the third layer and the second electrode layer, the capping layer comprises zirconium oxide.

16. The semiconductor layer stack of claim 15, wherein the dielectric layer comprises titanium oxide.

17. The semiconductor layer stack of claim 1, wherein the fourth layer has a thickness of between 10 A and 500 A.

18. The semiconductor layer stack of claim 1, wherein the dielectric layer directly interfaces the second layer.

19. The semiconductor layer stack of claim 1, wherein the conductive metal nitrides of the first layer and the fifth layer are titanium nitride, wherein the dielectric layer comprises aluminum doped titanium oxide having a rutile structure, and wherein the fourth layer comprises nickel oxide.

20. The semiconductor layer stack of claim 1, wherein the dielectric layer further comprises zirconium oxide.

* * * * *